United States Patent
Chiu et al.

(10) Patent No.: US 7,541,844 B2
(45) Date of Patent: Jun. 2, 2009

(54) CURRENT WEIGHTED VOLTAGE INTERPOLATION BUFFER

(75) Inventors: Wei-Ta Chiu, Taipei County (TW); Wen-Shian Shie, Taipei (TW)

(73) Assignee: NOVATEK Microelectronic Corp., Hsin-Chu (TW)

( * ) Notice: Subject to any disclaimer, the term of this patent is extended or adjusted under 35 U.S.C. 154(b) by 0 days.

(21) Appl. No.: 11/863,244

(22) Filed: Sep. 27, 2007

(65) Prior Publication Data

US 2008/0278200 A1    Nov. 13, 2008

(30) Foreign Application Priority Data

May 9, 2007    (TW) .............................. 96116497 A (51) Int. Cl.
*H03K 5/22* (2006.01)
(52) U.S. Cl. ........................................ 327/70; 327/103
(58) Field of Classification Search ................. 327/103, 327/70
See application file for complete search history.

(56) References Cited

U.S. PATENT DOCUMENTS 6,806,744 B1 * 10/2004 Bell et al. ...................... 327/70
2004/0263227 A1 * 12/2004 Baker et al. .................. 327/158

* cited by examiner

*Primary Examiner*—Kenneth B Wells
*Assistant Examiner*—John W Poos
(74) *Attorney, Agent, or Firm*—Winston Hsu (57) ABSTRACT

A voltage interpolation buffer for interpolating voltages by adjusting ratio of bias currents includes a first difference voltage to current unit for outputting corresponding difference current according to a first voltage, a first bias current and voltage of a voltage output end, a second difference voltage to current unit for outputting corresponding difference current according to a second voltage, a second bias current and the voltage of the voltage output end, and a current to voltage unit coupled to the first difference voltage to current unit, the second difference voltage to current unit and the voltage output end for outputting a interpolation result of the first voltage and the second voltage corresponding to a ratio of the first bias current and the second bias current according to the difference currents outputted by the first difference voltage to current unit and the second difference voltage to current unit.

18 Claims, 11 Drawing Sheets

| $I_1$ | $I_2$ | $V_{out}$ |
|---|---|---|
| 4 unit currents | 0 | 0.1V |
| 3 unit currents | 1 unit currents | 0.2V |
| 2 unit currents | 2 unit currents | 0.3V |
| 1 unit currents | 3 unit currents | 0.4V |
| 0 unit currents | 4 unit currents | 0.5V |

CURRENT WEIGHTED VOLTAGE INTERPOLATION BUFFER

BACKGROUND OF THE INVENTION

1. Field of the Invention

The present invention relates to a voltage interpolation buffer, and more particularly, to a voltage interpolation buffer by controlling a ratio of bias currents of two differential voltage-to-current conversion units to adjust weightings of input voltages for further outputting an interpolation result of the input voltages.

2. Description of the Prior Art

In the design of driving circuits, especially driving circuits of display devices, a voltage interpolation buffer is a common circuit unit for generating analog interpolation voltages needed by the driving circuits according to inputted reference voltages. However, in the prior art, realization of such functions usually needs an interpolation voltage generation unit for generating the interpolation voltages, as well as a voltage buffer for providing sufficient driving capability.

Figure 1:
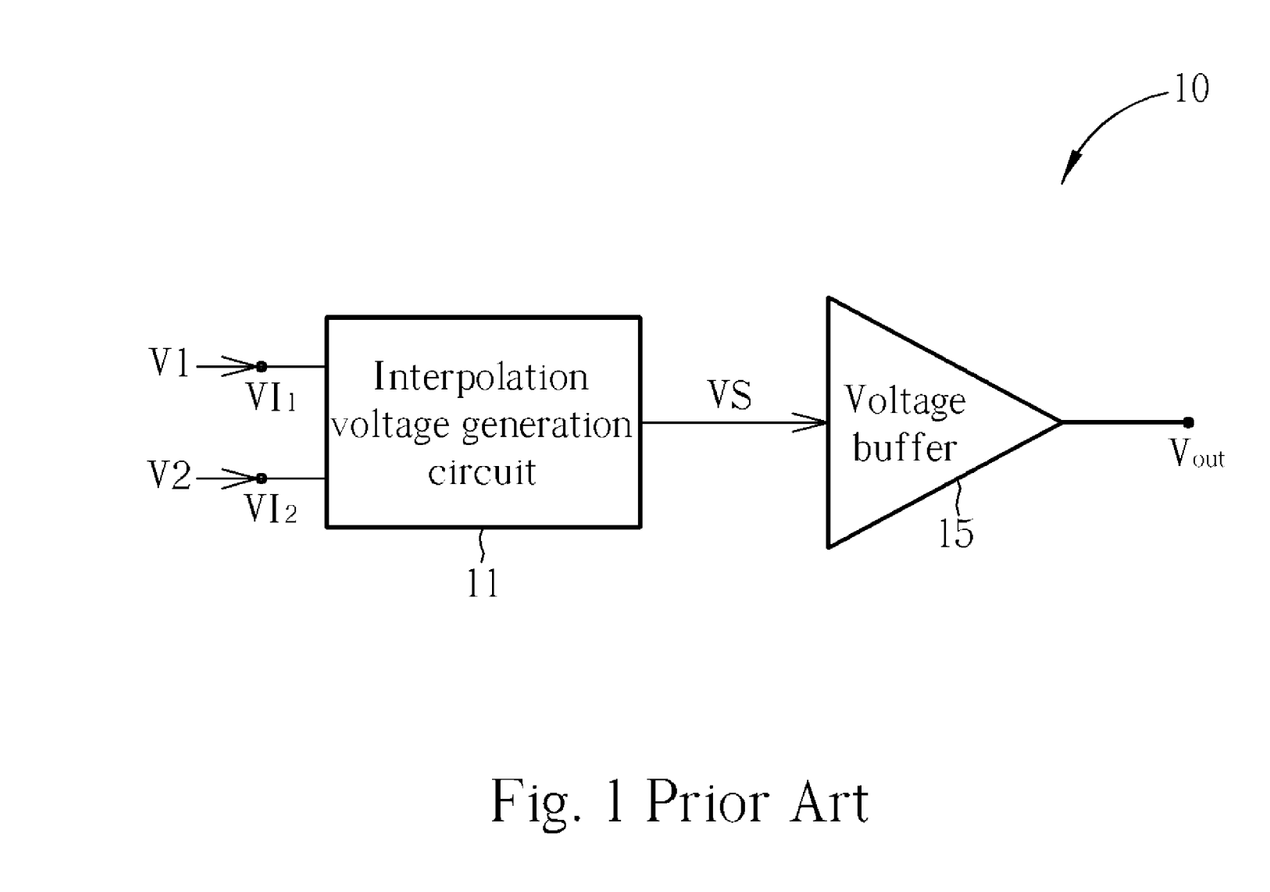
FIG. 1 is a schematic diagram of a prior art voltage interpolation buffer.

Please refer to FIG. 1. FIG. 1 is a schematic diagram of a prior art voltage interpolation buffer 10. The voltage interpolation buffer 10 includes a first voltage input terminal VI1, a second voltage input terminal VI2, an interpolation voltage generation circuit 11 and a voltage buffer 15. The first voltage input terminal VI1 and the second voltage input terminal VI2 are utilized for receiving a first voltage V1 and a second voltage V2, respectively. The interpolation voltage generation circuit 11 is coupled to the first voltage input terminal VI1 and the second voltage input terminal VI2, and is utilized for generating an interpolation voltage VS lying in-between the first voltage V1 and the second voltage V2 according to the first voltage V1 received by the first voltage input terminal VI1 and the second voltage V2 received by the second voltage input terminal VI2. The voltage buffer 15 is coupled to the interpolation voltage generation circuit 11, and is utilized for outputting a voltage buffering result through the voltage output terminal Vout. Therefore, the voltage interpolation buffer 10 utilizes the interpolation voltage generation circuit 11 for generating the demanded interpolation voltage VS, and then utilizes the voltage buffer 15 for buffering the voltage outputted by the interpolation voltage generation circuit 11 to be provided with a larger driving capability. As for operations of each part of the voltage interpolation buffer 10, detailed description is illustrated in the following.

Figure 2:
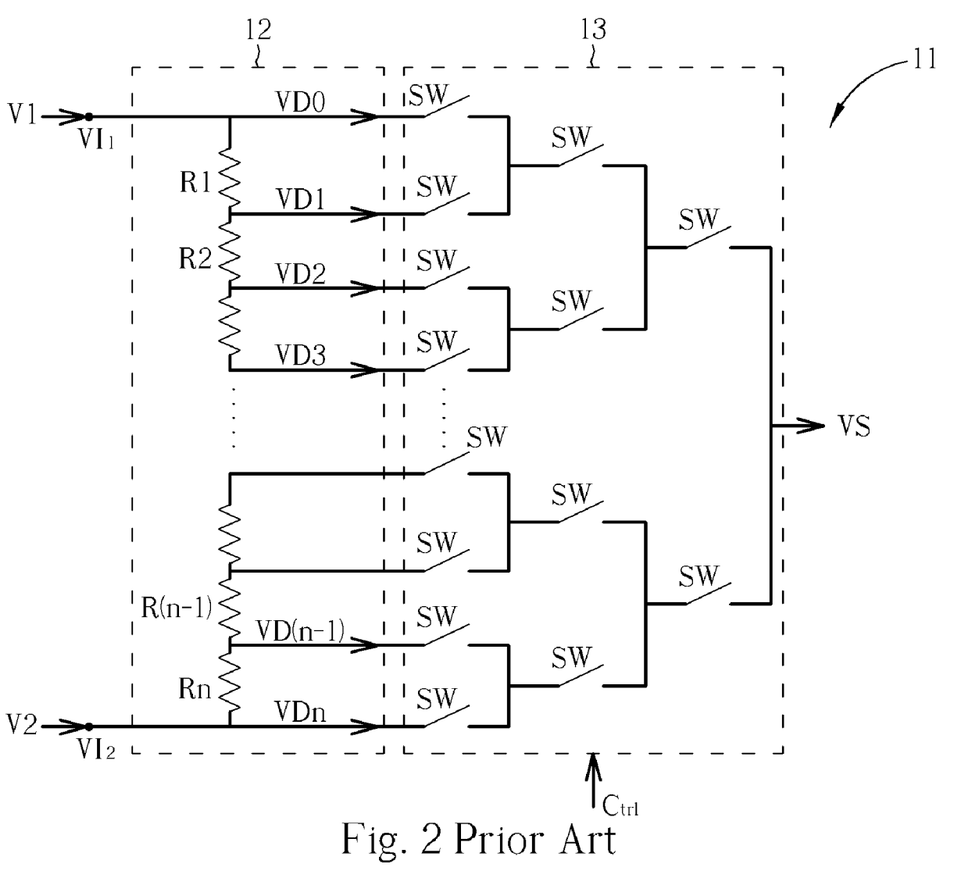
FIG. 2 is a schematic diagram of an interpolation voltage generation circuit in FIG. 1.

Please refer to FIG. 2. FIG. 2 is a schematic diagram of the interpolation voltage generation circuit 11 in FIG. 1. The interpolation voltage generation circuit 11 includes a voltage division circuit 12 and a switch circuit 13. The voltage division circuit 12 comprises resistors R1-Rn, which are coupled in series and coupled between the first voltage input terminal VI1 and the second voltage input terminal VI2, and is utilized for generating division voltages VD0-VDn according to the input voltages of the first voltage input terminal VI1 and the second voltage input terminal VI2. The switch circuit 13 is coupled to the voltage division circuit 12, and is utilized for switching to output one of the division voltages VD0-VDn generated by the voltage division circuit 12 according to a control signal Ctrl.

As shown in FIG. 2, the switch circuit 13 can comprise a plurality of switches SW. Therefore, the interpolation voltage generation circuit 11 can generate the division voltages VD0-VDn through the voltage division circuit 12, for the switch circuit 13 switching to output an interpolation voltage VS lying in-between the first voltage V1 and the second voltage V2. Generally speaking, with regard to the interpolation voltage generation circuit that utilizes series resistors for generating the interpolation voltages, the resistance value of the resistors R1-Rn has to be increased for the purpose of reducing current consumption, so as not to further consume too much power. Mostly, the methods for increasing the resistance value in integrated circuits can be generalized as two kinds: one is to use high resistance materials; and the other is to increase circuit layout area. However, both of the two methods will increase the production cost of the integrated circuits, which is one of the disadvantages of the prior art voltage interpolation buffer 10.

Figure 3:
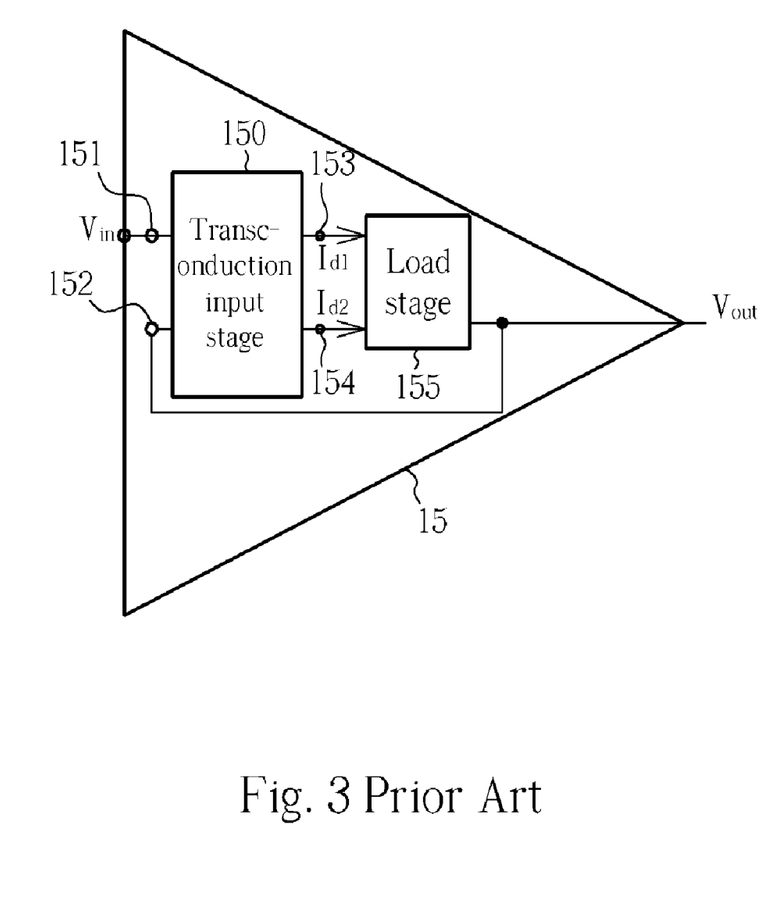
FIG. 3 is a schematic diagram of a voltage buffer in FIG. 1.

Please refer to FIG. 3. FIG. 3 is a schematic diagram of the voltage buffer 15 in FIG. 1. The voltage buffer 15 includes a transconduction input stage 150 and a load stage 155, and is utilized for outputting the voltage buffering result through the output terminal Vout according to the voltage received by the input terminal Vin. After receiving the voltage signals via a first input terminal 151 and a second input terminal 152, the transconduction input stage 150 outputs corresponding currents Id1 and Id2 to the load stage 155 through a first current output terminal 153 and a second current output terminal 154. The load stage 155 then outputs the corresponding voltage from the output terminal Vout according to the currents Id1 and Id2 of the first current output terminal 153 and the second current output terminal 154. Note that, the first input terminal 151 is coupled to the input terminal Vin, and the second input terminal 152 is coupled to the output terminal Vout. Therefore, by the way of feedback control, the voltage buffer 15 can output a voltage with a value equal to that of the voltage received by the input terminal Vin from the output terminal Vout, so as to achieve the function of voltage buffering.

Figure 4:
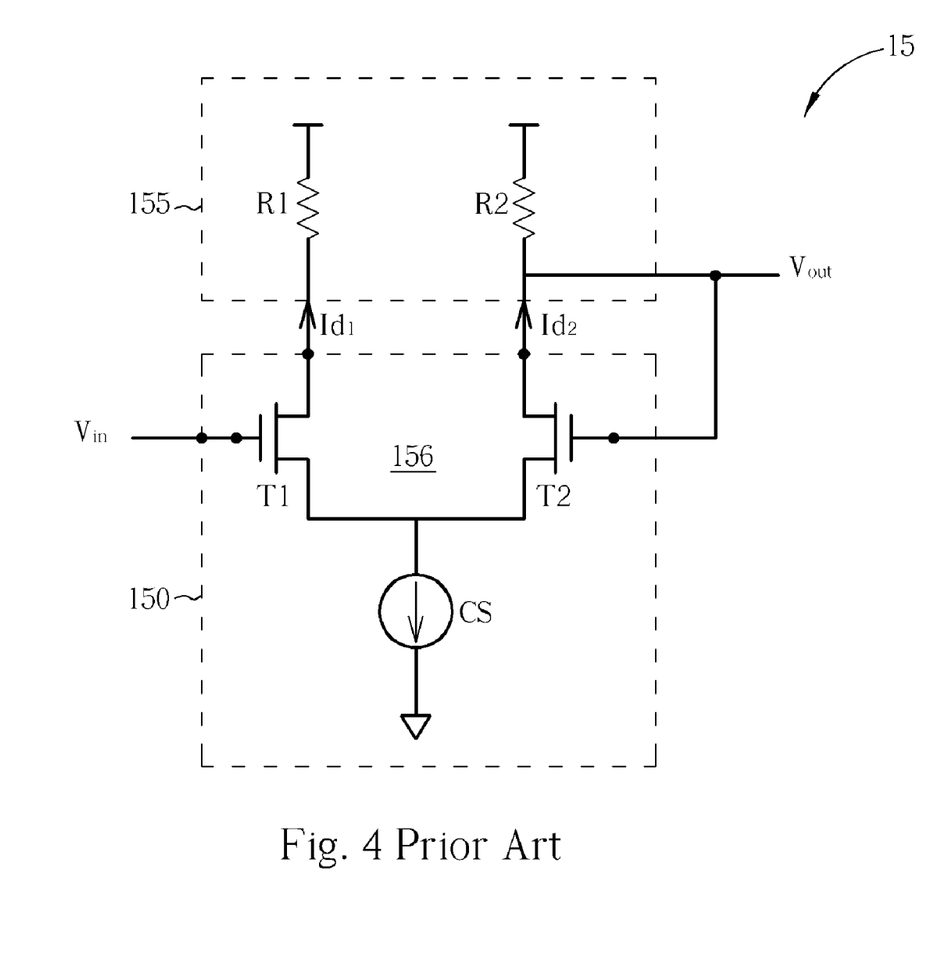
FIG. 4 is a schematic diagram of a circuit embodiment of the voltage buffer in FIG. 1.

Please further refer to FIG. 4. FIG. 4 is a schematic diagram of a circuit embodiment of the voltage buffer 15. The transconduction input stage 150 includes a differential pair 156 comprising transistors T1 and T2 and a bias current source CS; and the load stage 155 includes resistors R1 and R2, wherein the transistors T1 and T2 are a pair of matched transistors, the bias current source CS is utilized for providing a bias current of the differential pair 156, and the value of the resistor R1 is equal to that of the resistor R2. Therefore, when the input terminal Vin receives the interpolation voltage VS outputted by the interpolation voltage generation circuit 11, the voltage buffer 15 can convert the received differential voltage signal to the current signal through the transistors T1 and T2, and then output to the resistors R1 and R2. At last, the voltage buffering result is outputted from the output terminal Vout with larger driving capability.

In the prior art, the voltage interpolation buffer 10 has to combine the interpolation voltage generation circuit 11 and the voltage buffer 15 to achieve the function of voltage interpolation and voltage buffering. However, in this way, the resistor string has to be used for generating the division voltages, so as to increase the layout area of the integrated circuits and complicate the fabrication process, with a result that the production cost of the integrated circuits is increased.

SUMMARY OF THE INVENTION

It is therefore a primary objective of the present invention to provide a current weighted voltage interpolation buffer.

The present invention discloses a current weighted voltage interpolation buffer. The current weighted voltage interpolation buffer includes a first voltage input terminal for receiving a first input voltage; a second voltage input terminal for receiving a second input voltage; a first bias current input terminal for receiving a first bias current; a second bias current input terminal for receiving a second bias current; a voltage output terminal for outputting voltages; a first differential voltage to current conversion unit, coupled to the first voltage input terminal, the first bias current input terminal and the voltage output terminal, for outputting corresponding differential currents through a first current output terminal and a second current output terminal according to the first input voltage, the first bias current and a voltage of the voltage output terminal; a second differential voltage to current conversion unit, coupled to the second voltage input terminal, the second bias current input terminal and the voltage output terminal, for outputting corresponding differential currents through a third current output terminal and a fourth current output terminal according to the second input voltage, the second bias current and the voltage of the voltage output terminal; and a current to voltage conversion unit, coupled to the first differential voltage to current conversion unit, the second differential voltage to current conversion unit and the voltage output terminal, for outputting an interpolation result of the first input voltage and the second input voltage, corresponding to a ratio of the first bias current and the second bias current, to the voltage output terminal according to the differential currents outputted by the first differential voltage to current conversion unit and the second differential voltage to current conversion unit.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
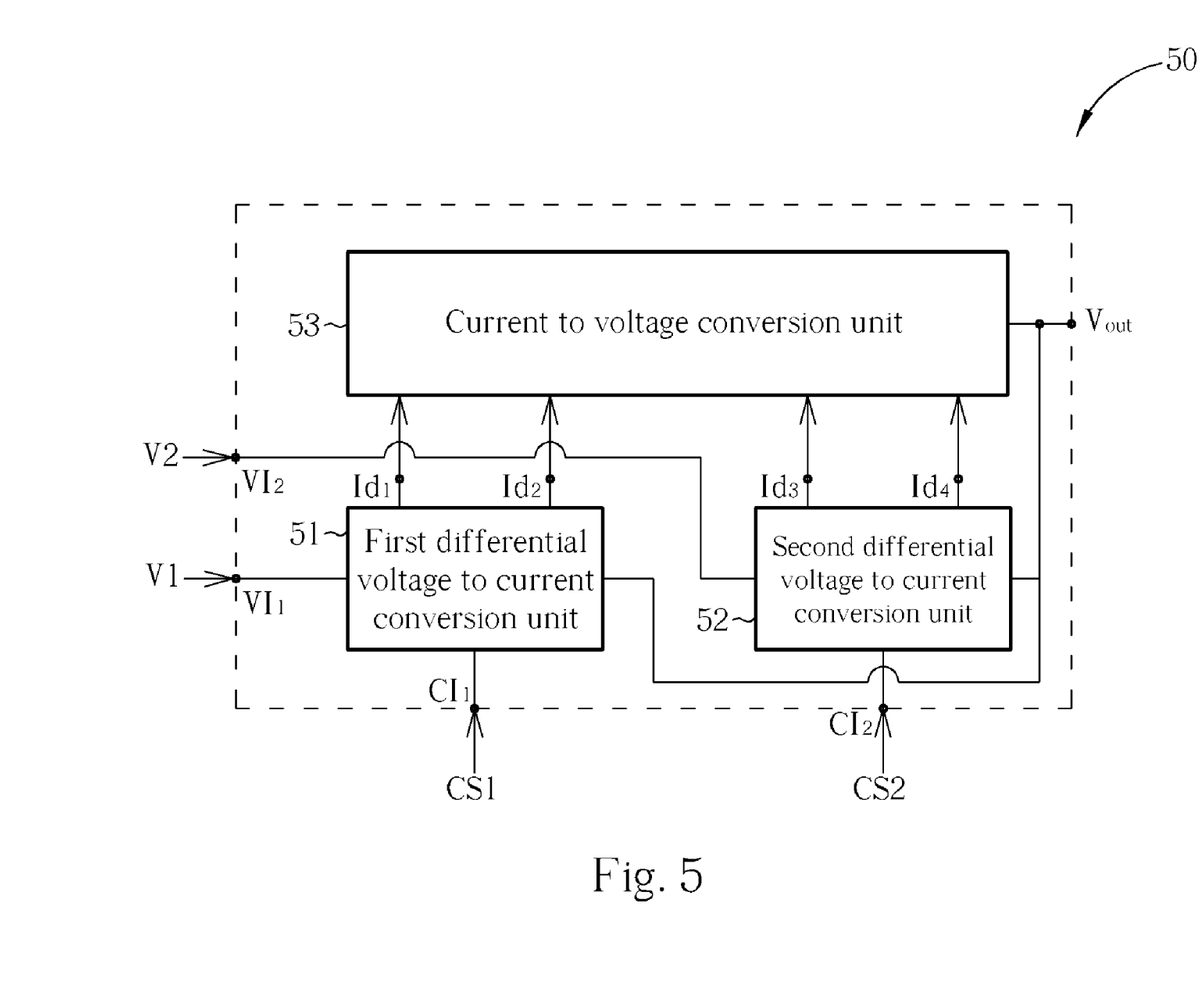
FIG. 5 is a schematic diagram of a current weighted voltage interpolation buffer of the present invention.

Please refer to FIG. 5. FIG. 5 is a schematic diagram of a current weighted voltage interpolation buffer 50 of the present invention. The voltage interpolation buffer 50 includes a first voltage input terminal VI1, a second voltage input terminal VI2, a first bias current input terminal CI1, a second bias current input terminal CI2, a first differential voltage to current conversion unit 51, a second differential voltage to current conversion unit 52, a current to voltage conversion unit 53 and a voltage output terminal Vout. The first voltage input terminal VI1 and the second voltage input terminal VI2 are respectively utilized for receiving a first voltage V1 and a second voltage V2. The first bias current input terminal CI1 and the second bias current input terminal CI2 are respectively utilized for receiving bias currents CS1 and CS2 provided for the first differential voltage to current conversion unit 51 and the second differential voltage to current conversion unit 52.

The first differential voltage to current conversion unit 51 is coupled to the first voltage input terminal VI1, the voltage output terminal Vout and the first bias current input terminal CI1, and is utilized for outputting corresponding differential currents Id1 and Id2 according to the received first voltage V1, voltages of the voltage output terminal Vout and the first bias current CS1. Similarly, the second differential voltage to current conversion unit 52 is coupled to the second voltage input terminal VI2, the voltage output terminal Vout and the second bias current input terminal CI2, and is utilized for outputting corresponding differential currents Id3 and Id4 according to the received second voltage V2, the voltages of the voltage output terminal Vout and the second bias current CS2. The current to voltage conversion unit 53 is coupled to the first differential voltage to current conversion unit 51, the second differential voltage to current conversion unit 52 and the voltage output terminal Vout, and is utilized for outputting an interpolation result of the first voltage V1 and the second voltage V2 corresponding to a ratio of the first bias current CS1 and the second bias current CS2 through the voltage output terminal Vout according to the differential currents Id1-Id4 outputted by the first differential voltage to current conversion unit 51 and the second differential voltage to current conversion unit 52.

Therefore, by controlling the ratio of the bias currents of the first differential voltage to current conversion unit conversion 51 and the second differential voltage to current conversion unit 52, the voltage interpolation buffer 50 of the present invention can adjust the weighting of the first voltage V1 and the second voltage V2 to output the interpolation result of the first voltage V1 and the second voltage V2. Furthermore, since the voltage interpolation buffer 50 is a circuit structure of a buffer, the present invention can still provide voltage buffering for the first voltage V1 and the second voltage V2.

By comparison, the prior art has to combine the voltage division circuit and the voltage buffer for achieving the function of voltage interpolation and voltage buffering. In the present invention, the voltage interpolation buffer can set the weighting value of the inputted first voltage and second voltage by controlling the ratio of the bias currents of the two differential voltage to current conversion unit, and thus, except for voltage buffering, the present invention can obtain the interpolation result of the first voltage and the second voltage at the same time. In this case, since only the values of the bias currents need to be controlled, the present invention can be easily realized in the integrated circuits, and the layout area can also be reduced effectively, so that the production cost of the integrated circuits can further be reduced.

Figure 11:
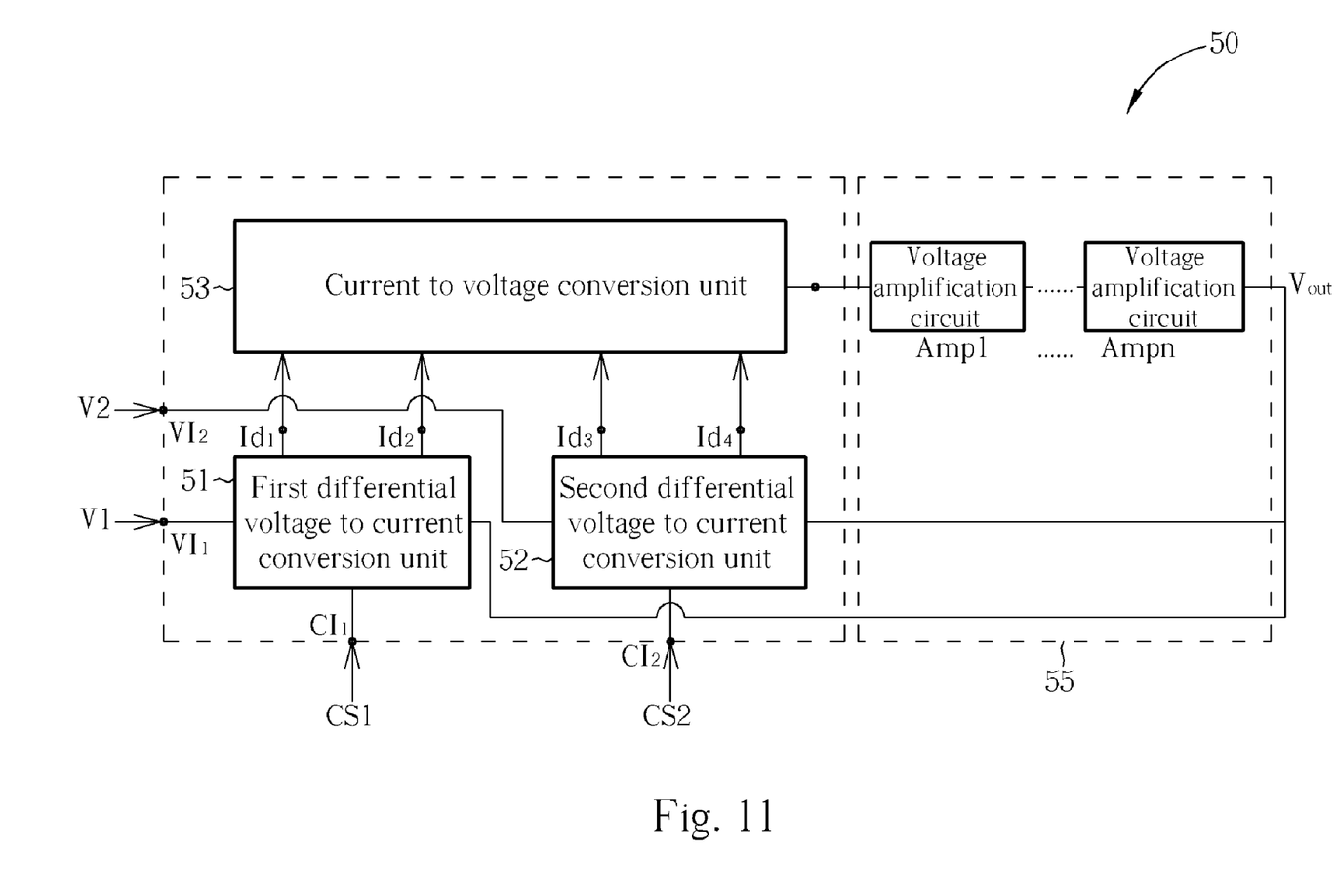
FIG. 11 is a schematic diagram of an exemplary embodiment applying the voltage interpolation buffer of the present invention.

Besides, please refer to FIG. 11. FIG. 11 is a schematic diagram of an exemplary embodiment applying the voltage interpolation buffer 50 of the present invention. As shown in FIG. 11, the voltage interpolation buffer 50 can further include a voltage amplification unit 55. The voltage amplification unit 55 is coupled between the current to voltage conversion unit 53 and the voltage output terminal Vout, and is utilized for outputting a voltage amplification result to the voltage output terminal Vout according to the interpolation result outputted by the current to voltage conversion unit 53. Thus, the driving capability of the voltage interpolation buffer 50 can further be enhanced. Preferably, depending on practical demands, the voltage amplification unit 55 can comprise a plurality of voltage amplification circuits Amp1-Ampn, which will not influence its original function.

Figure 6:
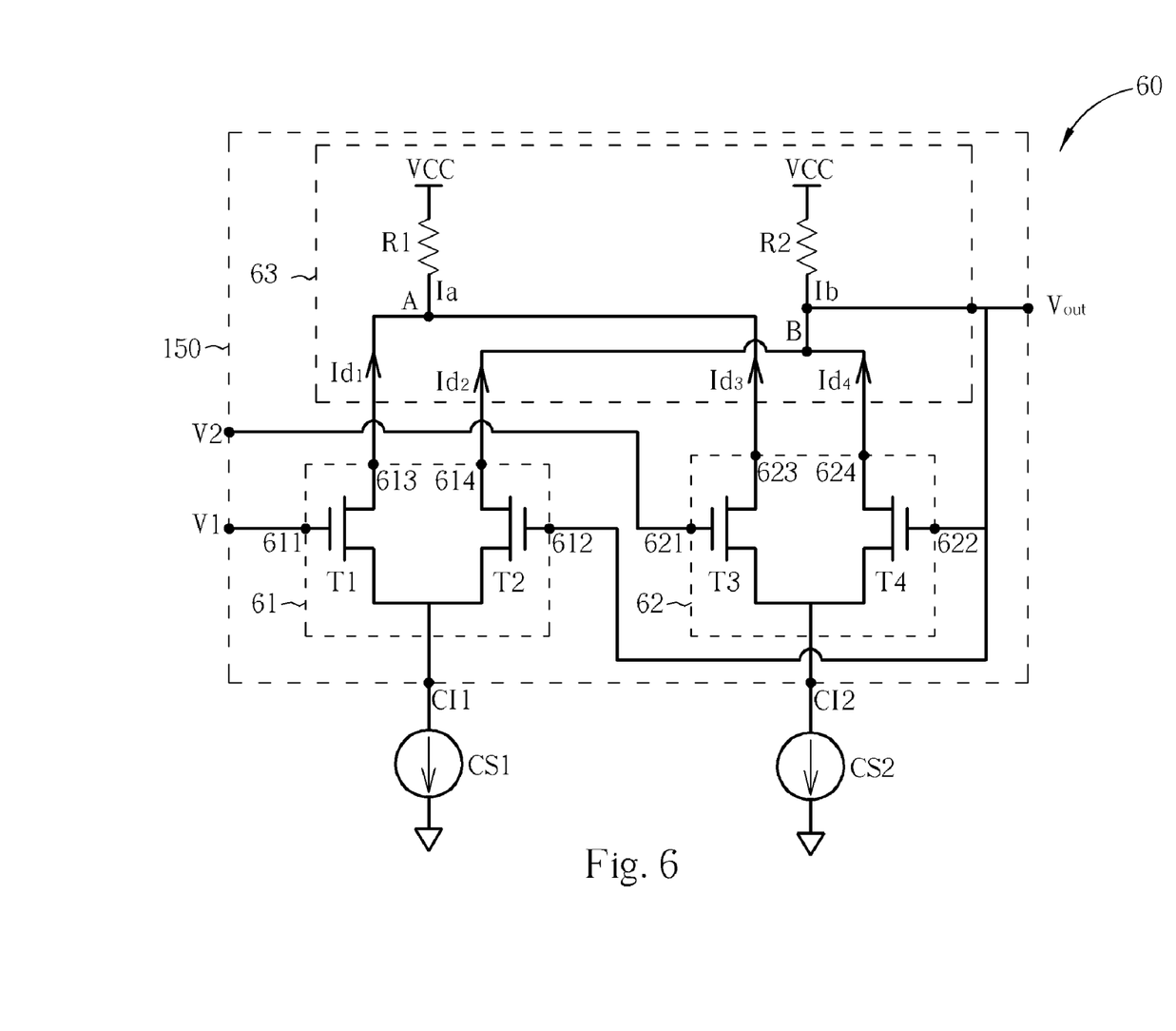
FIG. 6 is a schematic diagram of a circuit embodiment of the voltage interpolation buffer of the present invention.

Please refer to FIG. 6. FIG. 6 is a schematic diagram of a circuit embodiment of the voltage interpolation buffer 60 of the present invention. The voltage interpolation buffer 60 is utilized for realizing the voltage interpolation buffer 50 in FIG. 5. In the voltage interpolation buffer 60, a first differential voltage to current conversion unit 61 and a second differential voltage to current conversion unit 62 can comprise transistors T1 and T2 and transistors T3 and T4, respectively, and are utilized for converting the received differential voltage signals to the current signals. The related operations are similar to the transconduction input stage 150 in FIG. 4, and thus are not narrated herein. Besides, a current to voltage conversion unit 63 comprises resistors R1 and R2 with the same resistance value. As shown in FIG. 6, the resistor R1 has one end coupled to a supply voltage Vcc and the other end coupled to a node A with the first current output terminal 613 of the first differential voltage to current conversion unit 61 and the first current output terminal 623 of the second differential voltage to current conversion unit 62, and the resistor R2 has one end coupled to the supply voltage Vcc and the other end coupled to a node B with the second current output terminal 614 of the first differential voltage to current conversion unit 61 and the second current output terminal 624 of the second differential voltage to current conversion unit 62.

Therefore, when the first differential voltage to current conversion unit 61 and the second differential voltage to current conversion unit 62 receives the differential voltage signals, the first differential voltage to current conversion unit 61 and the second differential voltage to current conversion unit 62 can adjust the ratio of the differential currents outputted by the first differential voltage to current conversion unit 61 and the second differential voltage to current conversion unit 62 according to the received differential voltage signals and the bias currents CS1 and CS2. Then, the current to voltage conversion unit 63 can output the corresponding voltages through the voltage output terminal Vout according to currents Ia and Ib of the nodes A and B.

Note that, the voltage output terminal Vout is further coupled to the second voltage input terminal 612 of the first differential voltage to current conversion unit 61 and the second voltage input terminal 622 of the second differential voltage to current conversion unit 62, for feedback controlling the first differential voltage to current conversion unit conversion 61 and the second differential voltage to current conversion unit conversion 62. Therefore, with the first differential voltage to current conversion unit 61 and the second differential voltage to current conversion unit 62, the voltage interpolation buffer 60 can adjust to output the corresponding differential currents Id1-Id4 according to the first voltage V1, the second voltage V2 and the ratio of the bias currents CS1 and CS2, and then output the interpolation result of the first voltage V1 and the second voltage V2 through the current to voltage conversion unit 63.

As well known by those skilled in the art, the output voltage of the differential voltage to current conversion unit is proportional to the multiplication product of the input voltage and the transconduction (gm), and the transconduction (gm) is further proportional to the bias current of the differential voltage to current conversion unit. Thus, in the present invention, the voltage V outputted by the voltage output terminal Vout can be expressed as: $V=(V1*M+V2*N)/(M+N)$, among which the symbols M and N represent that the ratio of the bias currents CS1 and CS2 is M:N. That means, as long as the ratio of the bias currents of the two differential voltage to current conversion units is set appropriately, the desired interpolation result can then be obtained. In addition, the resistance values of the resistors R1 and R2 can be set different for further adjusting the proportion between the output voltage V, and the first voltage V1 and the second voltage V2.

Figure 7:
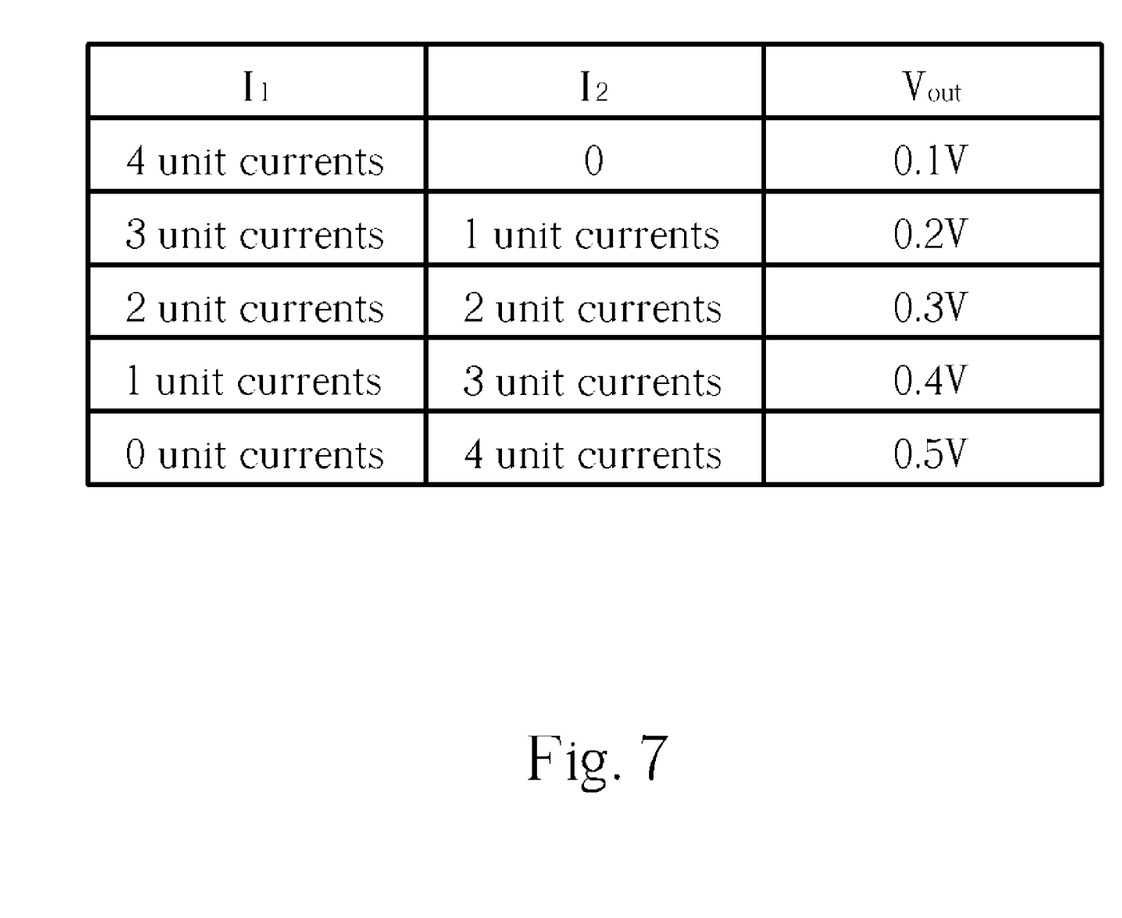
FIG. 7 is a schematic diagram of the relation between the ratio of the bias currents and the output voltage interpolation result.

For example, when implementing a voltage interpolation buffer capable of generating interpolation voltages such as 0.2V, 0.3V and 0.4V, the present invention can respectively input 0.1V and 0.5V into the first voltage input terminal VI1 and the second voltage input terminal VI2, and divide the sum of the first bias current CS1 and the second bias current CS2 into 4 units. In this case, the present invention only needs to allocate the bias currents properly, so that the desired interpolation result can be obtained. If allocating 4 units for the first bias current CS1 and 0 units for the second bias current CS2, the output voltage from the voltage output terminal Vout of the voltage interpolation buffer 50 is completely determined by the first differential voltage to current conversion unit 51, and thus the output voltage is equal to the first voltage V1, that is 0.1 V. In the same manner, if allocating 0 units for the first bias current CS1 and 4 units for the second bias current CS2, the output voltage is equal to the second voltage V2, that is 0.5 V. Similarly, if evenly allocating 2 units for the first bias current CS1 and the second bias current CS2, because of the same bias currents, the weighting of the first voltage V1 and the second voltage V2 is also the same, and thus the output voltage becomes 0.3V. Further, if adjusting the ratio of the first bias current CS1 and the second bias current CS2 as 3:1 or 1:3, the voltage interpolation buffer then adjusts the weighting of the first voltage V1 and the second voltage V2 according to the ratio of the bias currents for outputting 0.2 V and 0.4 V, respectively. The mentioned relation between the ratio of the bias currents and the output voltage interpolation result is illustrated in FIG. 7.

Therefore, except for the function of voltage buffering, the voltage interpolation buffer of the present invention can obtain the desired voltage interpolation result lying in-between the first voltage V1 and the second voltage V2 by properly adjusting the ratio of the bias currents. For obtaining the desired interpolation voltage, the voltage interpolation buffer 50 can further include a bias current distribution unit 54. The bias current distribution unit 54 would be coupled to the first bias current input terminal CI1 and the second bias current input terminal CI2, and utilized for adjusting the ratio of the first bias current CS1 and the second bias current CS2.

Figure 8:
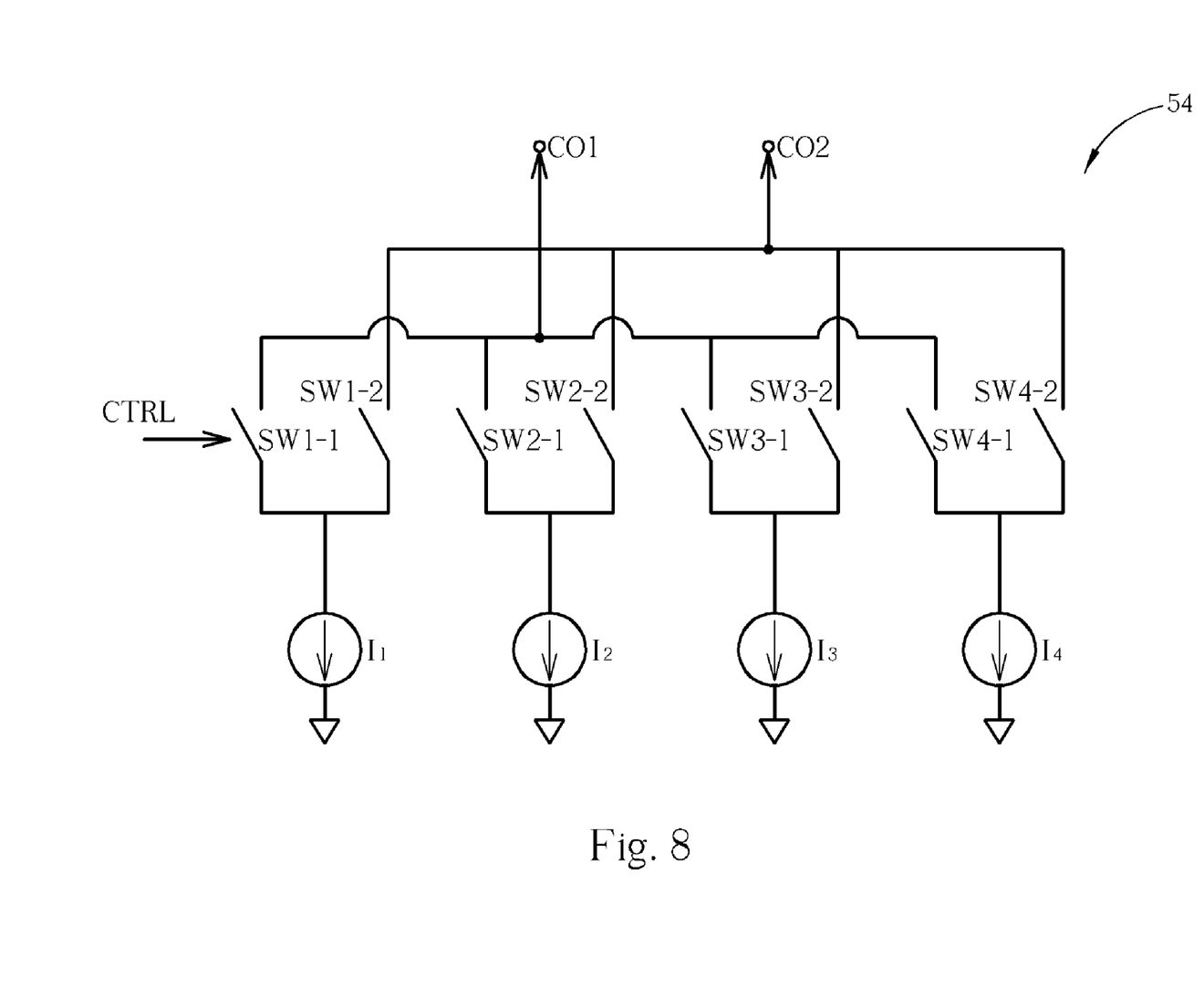
FIG. 8 is a schematic diagram of an exemplary embodiment of a bias current distribution unit.

Please refer to FIG. 8. FIG. 8 is a schematic diagram of an exemplary embodiment of the bias current distribution unit 54. The bias current distribution unit 54 includes a first bias current output terminal CO1, a second bias current output terminal CO2, current sources I1-I4 and switches SW1-1, SW1-2-SW4-1 and SW4-2. The current sources I1-I4 are utilized for providing currents, each with the same current value. The switches SW1-1, SW1-2-SW4-1 and SW4-2 respectively corresponds to the current sources I1-I4, and are utilized for switching the currents of the current sources I1-I4 to the first bias current output terminal CO1 or the second bias current output terminal CO2 according to a control signal CTRL. The first bias current output terminal CO1 and the second bias current output terminal CO2 are utilized for outputting corresponding bias currents to the first bias current input terminal CI1 and the second bias current input terminal CI2, respectively. For example, when the desired ratio of the bias currents is 3:1, the bias current distribution unit 54 can switch the current sources I1-I3 to the first bias current output terminal CO1 and the current source 14 to the second bias current output terminal CO2 according to the control signal CTRL. Therefore, the voltage interpolation buffer 50 can output the desired voltage interpolation result according to the controllable bias current ratio.

Figure 9:
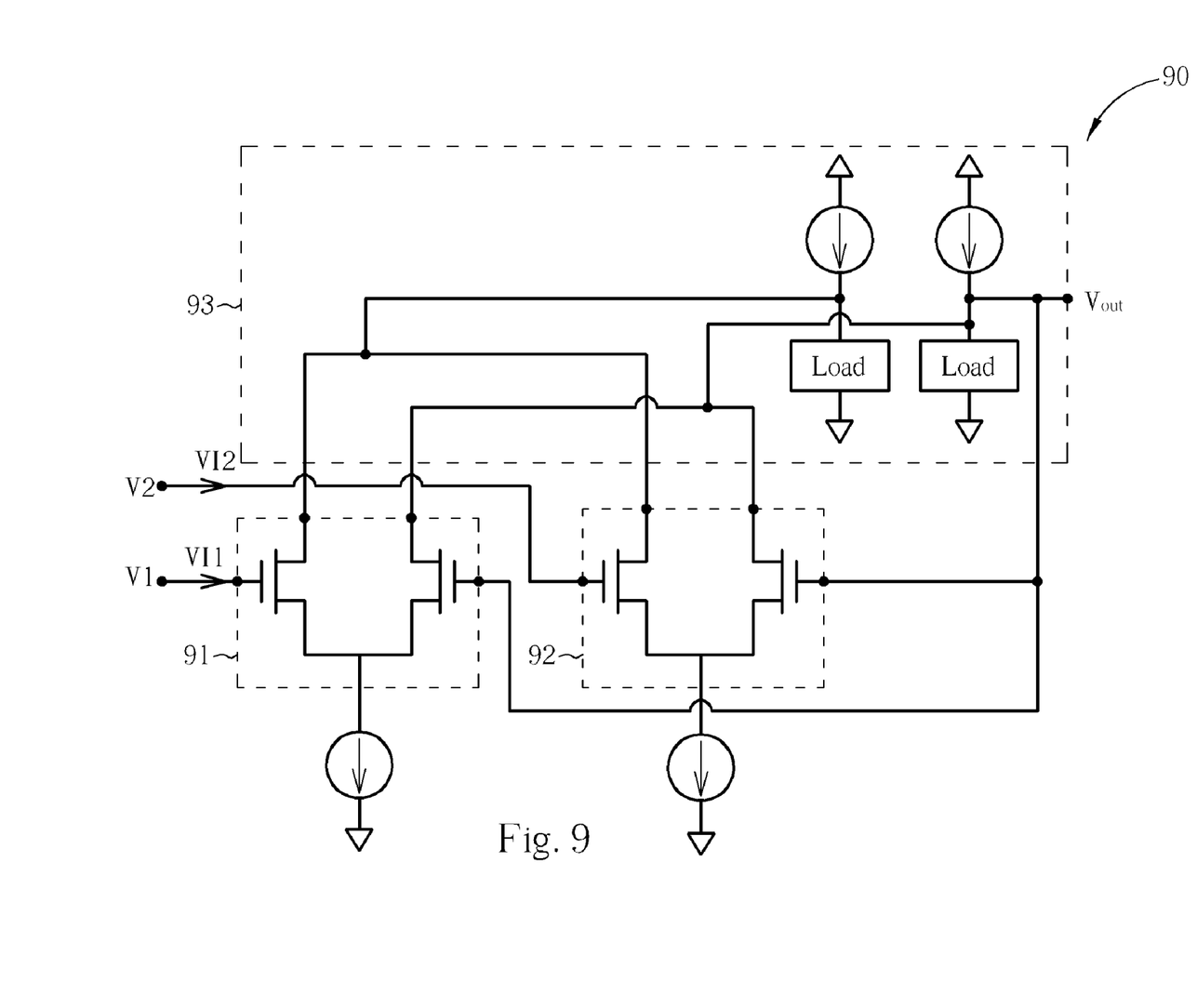
FIG. 9 is a schematic diagram of a voltage interpolation buffer according to another circuit embodiment of the present invention.

Please note that the voltage interpolation buffer 60 as shown in FIG. 6 is merely a derivative embodiment according to the voltage interpolation buffer 50 in FIG. 5, but not a limitation of the present invention, and the designer can make appropriate modifications. For example, please refer to FIG. 9. FIG. 9 is a schematic diagram of a voltage interpolation buffer 90 according to another circuit embodiment of the present invention. Compared with FIG. 6, the first differential voltage to current conversion unit 91 and the second differential voltage to current conversion unit 92 are similar to the first differential voltage to current conversion unit 61 and the second differential voltage to current conversion unit 62, and the current to voltage conversion unit 93 is an exemplary embodiment after an appropriate modification according to practical demands, which still has the same function as the current to voltage conversion unit 63 in FIG. 6.

Figure 10:
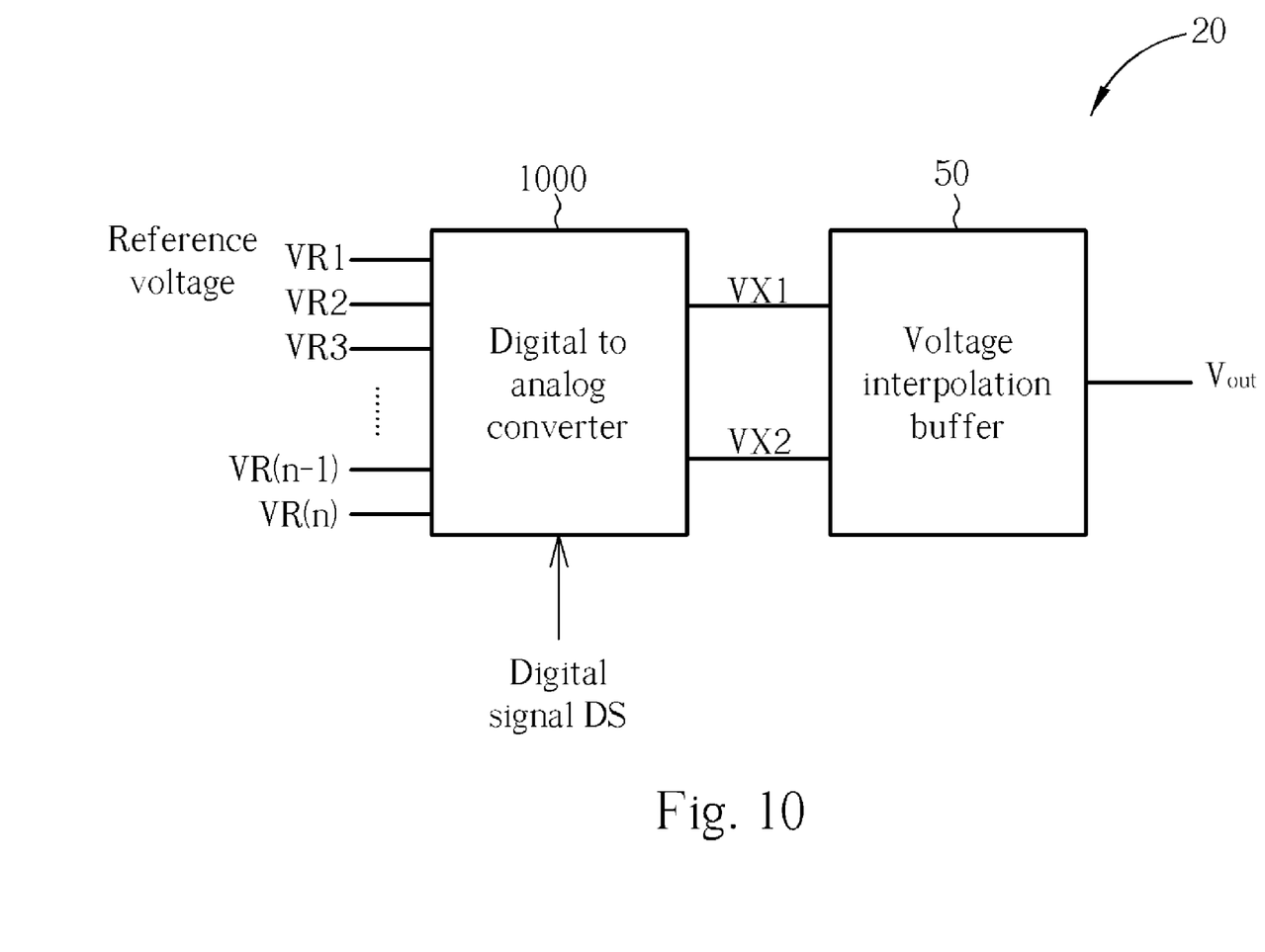
FIG. 10 is a schematic diagram of a digital to analog conversion device applying the voltage interpolation buffer of the present invention.

Moreover, those skilled in the art can apply the voltage interpolation buffer 50 of the present invention in various electronic devices; for example, the voltage interpolation buffer 50 can be used for increasing the resolution of a digital to analog converter. Please refer to FIG. 10. FIG. 10 is a schematic diagram of a digital to analog conversion device 20 applying the voltage interpolation buffer 50 of the present invention. The digital to analog conversion device 20 includes a digital to analog converter 1000 and the voltage interpolation buffer 50. The digital to analog converter 1000 is utilized for switching to output a first reference voltage VX1 and a second reference voltage VX2 from a plurality of reference voltages VR1-VRn according to a digital signal DS. The first reference voltage VX1 and the second reference voltage VX2 are two adjacent reference voltages of the reference voltages VR1-VRn. The voltage interpolation buffer 50, coupled to the digital to analog converter 1000, can be utilized for generating a desired interpolation voltage according to the reference voltages VX1 and VX2 outputted from the digital to analog converter 1000, so as to increase the resolution of the digital to analog conversion device 20. For example, if the digital to analog converter 1000 is a 2 bit digital to analog converter, when the voltage interpolation buffer 50 generates an interpolation voltage by 2 unit bias currents, the resolution of the digital to analog conversion device 20 can thus be enhanced to 3 bits. Therefore, without increasing the number of the reference voltages, i.e. without increasing the voltage division resistors of the digital to analog converter 1000, the digital to analog conversion device 20 can enhance the resolution and save the production cost as well.

As mentioned above, by controlling the ratio of the bias currents of the two differential voltage to current conversion units, the voltage interpolation buffer of the present invention can adjust the weighting of the first voltage and the second voltage to output the interpolation result of the first voltage and the second voltage. In addition, since the voltage interpolation buffer is a circuit structure of a buffer, the present invention can still provide the function of voltage buffering. Thus, the present invention can be easily realized in the integrated circuits; and since the voltage division resistors can be saved, the layout area can be reduced effectively and the reliability can also be enhanced, so as to further lower the production cost.

Those skilled in the art will readily observe that numerous modifications and alterations of the device and method may be made while retaining the teachings of the invention.

What is claimed is:

1. A current weighted voltage interpolation buffer comprising:
    a first voltage input terminal for receiving a first input voltage;
    a second voltage input terminal for receiving a second input voltage;
    a first bias current input terminal for receiving a first bias current;
    a second bias current input terminal for receiving a second bias current;
    a voltage output terminal for outputting voltages;
    a first differential voltage to current conversion unit, coupled to the first voltage input terminal, the first bias current input terminal and the voltage output terminal, for outputting corresponding differential currents through a first current output terminal and a second current output terminal according to the first input voltage, the first bias current and a voltage of the voltage output terminal;
    a second differential voltage to current conversion unit, coupled to the second voltage input terminal, the second bias current input terminal and the voltage output terminal, for outputting corresponding differential currents through a third current output terminal and a fourth current output terminal according to the second input voltage, the second bias current and the voltage of the voltage output terminal; and
    a current to voltage conversion unit, coupled to the first differential voltage to current conversion unit, the second differential voltage to current conversion unit and the voltage output terminal, for outputting an interpolation result of the first input voltage and the second input voltage, corresponding to a ratio of the first bias current and the second bias current, to the voltage output terminal according to the differential currents outputted by the first differential voltage to current conversion unit and the second differential voltage to current conversion unit.

2. The voltage interpolation buffer of claim 1, wherein the first differential voltage to current conversion unit is a differential input pair.

3. The voltage interpolation buffer of claim 2, wherein the differential input pair is a pair of matched transistors, and comprises:
    a first transistor, having a first terminal coupled to the first current output terminal, a second terminal coupled to the first bias current input terminal and a third terminal coupled to the first voltage input terminal, for controlling electrical connection between the first terminal and the second terminal according to a voltage signal received by the third terminal; and
    a second transistor, having a first terminal coupled to the second current output terminal, a second terminal coupled to the first bias current input terminal and a third terminal coupled to the voltage output terminal, for controlling electrical connection between the first terminal and the second terminal according to a voltage signal received by the third terminal.

4. The voltage interpolation buffer of claim 1, wherein the second differential voltage to current conversion unit is a differential input pair.

5. The voltage interpolation buffer of claim 4, wherein the differential input pair is a pair of matched transistors, and comprises:
- a first transistor, having a first terminal coupled to the third current output terminal, a second terminal coupled to the second bias current input terminal and a third terminal coupled to the second voltage input terminal, for controlling electrical connection between the first terminal and the second terminal according to a voltage signal received by the third terminal; and
- a second transistor, having a first terminal coupled to the fourth current output terminal, a second terminal coupled to the second bias current input terminal and a third terminal coupled to the voltage output terminal, for controlling electrical connection between the first terminal and the second terminal according to a voltage signal received by the third terminal.

6. The voltage interpolation buffer of claim 1, wherein the current to voltage conversion unit comprises:
- a first load having one end coupled to a voltage source and another end coupled to the first current output terminal and the third current output terminal; and
- a second load having one end coupled to the voltage source and another end coupled to the second current output terminal, the fourth current output terminal and the voltage output terminal.

7. The voltage interpolation buffer of claim 6, wherein the first load is a resistor.

8. The voltage interpolation buffer of claim 6, wherein the first load is an active load.

9. The voltage interpolation buffer of claim 6, wherein the second load is a resistor.

10. The voltage interpolation buffer of claim 6, wherein the second load is an active load.

11. The voltage interpolation buffer of claim 1, wherein the current to voltage conversion unit comprises:
- a first load having one end coupled to a ground terminal and another end coupled to the first current output terminal, the third current output terminal, and a first current source; and
- a second load having one end coupled to the ground terminal and another end coupled to the second current output terminal, the fourth current output terminal, and a second current source.

12. The voltage interpolation buffer of claim 11, wherein the first load is a resistor.

13. The voltage interpolation buffer of claim 11, wherein the first load is an active load.

14. The voltage interpolation buffer of claim 11, wherein the second load is a resistor.

15. The voltage interpolation buffer of claim 11, wherein the second load is an active load.

16. The voltage interpolation buffer of claim 1 further comprising a bias current distribution unit, wherein the bias current distribution unit is coupled to the first bias current input terminal of the first differential voltage to current conversion unit and the second bias current input terminal of the second differential voltage to current conversion unit, and adjusts the ratio of the first bias current and the second bias current.

17. The voltage interpolation buffer of claim 1 further comprising a voltage amplification unit, wherein the voltage amplification unit is coupled between the current to voltage conversion unit and the voltage output terminal, and outputs a voltage amplification result to the voltage output terminal according to the interpolation result outputted by the current to voltage conversion unit.

18. The voltage interpolation buffer of claim 17, wherein the voltage amplification unit comprises a plurality of voltage amplification circuits.

* * * * *

UNITED STATES PATENT AND TRADEMARK OFFICE
CERTIFICATE OF CORRECTION

PATENT NO. : 7,541,844 B2  Page 1 of 1
APPLICATION NO. : 11/863244
DATED : June 2, 2009
INVENTOR(S) : Wei-Ta Chiu et al.

It is certified that error appears in the above-identified patent and that said Letters Patent is hereby corrected as shown below:

On the title page, item (73), correct the name of the Assignee from "NOVATEK Microelectronic Corp." to "NOVATEK Microelectronics Corp."

Signed and Sealed this

First Day of September, 2009

David J. Kappos
*Director of the United States Patent and Trademark Office*